United States Patent
Wilson

(10) Patent No.: US 8,958,261 B1
(45) Date of Patent: Feb. 17, 2015

(54) LOW POWER PROTECTION CIRCUIT

(71) Applicant: Nanya Technology Corporation, Taoyuan (TW)

(72) Inventor: Alan John Wilson, Boise, ID (US)

(73) Assignee: Nanya Technology Corporation, Taoyuan (TW)

( * ) Notice: Subject to any disclaimer, the term of this patent is extended or adjusted under 35 U.S.C. 154(b) by 22 days.

(21) Appl. No.: 14/014,397

(22) Filed: Aug. 30, 2013

(51) Int. Cl.
*G11C 5/14* (2006.01)
*G11C 11/4074* (2006.01)

(52) U.S. Cl.
CPC .................................. *G11C 11/4074* (2013.01)
USPC ......................................................... 365/226

(58) Field of Classification Search
CPC .......... G11C 5/14; G11C 5/143; G11C 5/144; G11C 5/145; G11C 5/147; G11C 5/148
USPC ......................................................... 365/226
See application file for complete search history.

(56) References Cited

U.S. PATENT DOCUMENTS

| | | | | |
|---|---|---|---|---|
| 7,123,079 | B2 * | 10/2006 | Do | 327/536 |
| 8,587,366 | B2 * | 11/2013 | Im | 327/536 |
| 8,643,357 | B2 * | 2/2014 | Son et al. | 323/299 |

* cited by examiner

*Primary Examiner* — Harry W Byrne
*Assistant Examiner* — Lance Reidlinger
(74) *Attorney, Agent, or Firm* — Jianq Chyun IP Office

(57) ABSTRACT

The present invention provides the low power protection circuit including a first voltage detector, a pulse generating circuit, a SR latch, and an output logic operation circuit. The low power protection circuit is adapted for a dynamic random access memory (DRAM) with dual operating voltages. The first voltage detector generates a high-voltage pump enable signal by detecting a voltage level of the power-up signal. The pulse generating circuit generates a power-up pulse according to the power-up signal. The SR latch receives the power-up pulse, the high-voltage pump enable signal and an inverted power-up signal, and generates an output signal. The second voltage detector generates a low-voltage pump enable signal by detecting a voltage level of the output signal. The output logic operation circuit generates a pump enable signal according to the low-voltage pump enable signal and the high-voltage pump enable signal.

10 Claims, 3 Drawing Sheets

LOW POWER PROTECTION CIRCUIT

BACKGROUND OF THE INVENTION

1. Field of Invention

The present invention generally relates to a low power protection circuit, and more particularly to a low power protection circuit adapted for a voltage pump circuit of a dynamic random access memory (DRAM) with dual operating voltages.

2. Description of Prior Art

Along with the rapid development of science and technology at the present, semiconductor memories are widely used in currently electronic products. In a conventional dynamic access memory (DRAM), dual operating voltages are used in the DRAM. The second operating voltage with lower voltage level is used to allow the DRAM to function correctly. The first operating voltage with higher voltage level is used to help make a voltage pump circuit of the DRAM more efficient.

Referring to FIG. 1, FIG. 1 is a waveform plot of the conventional DRAM. During a timing period T0, the operating voltages VDD1 and VDD2 are raised, and the operating voltages VDD1 reaches to a first stable voltage level earlier. The pump output voltage VCCP generated by the voltage pump circuit may go to runaway (too high) when the operating voltages VDD1 reaches to the first stable voltage level and the second operating voltage VDD2 fails to reach a second stable voltage level. After a timing period T1 and during a timing period T2, the first and second operating voltages VDD1 and VDD2 go to low, and the second operating voltage VDD2 is reduced earlier. The pump output voltage VCCP generated by the voltage pump circuit may go to runaway again when the first operating voltage VDD1 is kept at the first stable voltage level, and the second operating voltage VDD2 is reduced too low.

SUMMARY OF THE INVENTION

The present invention provides a low power protection circuit for avoiding a voltage pump circuit of a DRAM to go to runaway.

The present invention provides the low power protection circuit including a first voltage detector, a pulse generating circuit, a SR latch, and an output logic operation circuit. The low power protection circuit is adapted for a dynamic random access memory (DRAM) with dual operating voltages. The first voltage detector receives a power-up signal and generates a high-voltage pump enable signal by detecting a voltage level of the power-up signal. The pulse generating circuit receives the power-up signal and generates a power-up pulse according to the power-up signal. The SR latch has a set end, a first and second reset ends and an output end. The set end of the SR latch receives the power-up pulse, the first and second reset ends of the SR latch respectively receives the high-voltage pump enable signal and an inverted power-up signal, and the output end of the SR latch generates an output signal. The second voltage detector receives the output signal and generates a low-voltage pump enable signal by detecting a voltage level of the output signal. The output logic operation circuit receives the low-voltage pump enable signal and the high-voltage pump enable signal and generates a pump enable signal according to the low-voltage pump enable signal and the high-voltage pump enable signal. Wherein, the pump enable signal is used to enable or disable an operation of a voltage pump circuit of the DRAM.

Accordingly, the low power protection circuit provides the first and second voltage detectors for detecting the voltage levels of the dual operating voltages. The low power protection circuit generates the pump enable signal according to the detecting result from the first and second voltage detectors. Such as that, the voltage pump circuit of the DRAM is controlled according to the variation of the first and second operating voltages, and the voltage pump circuit does not go to runaway.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
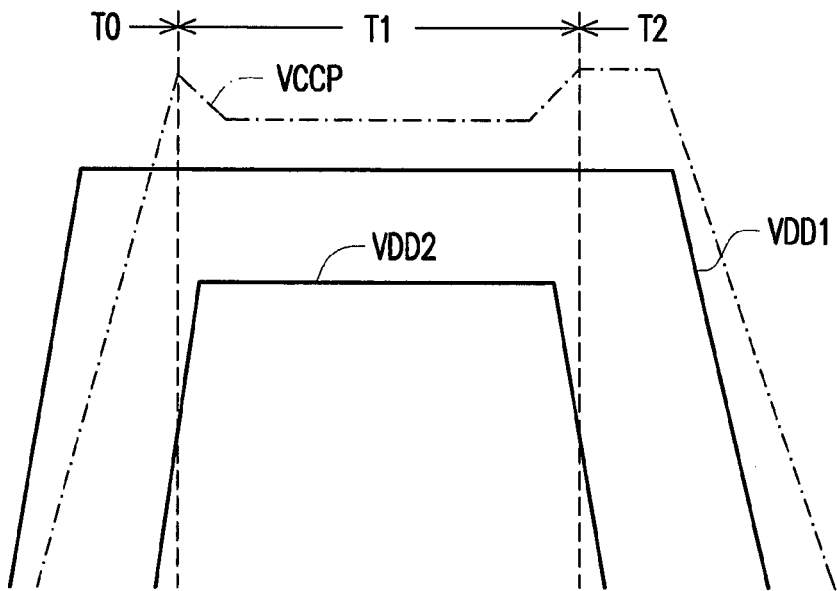
FIG. 1 is a waveform plot of the conventional DRAM.

Reference will now be made in detail to the present preferred embodiment of the invention, examples of which are illustrated in the accompanying drawings. Wherever possible, the same reference numbers are used in the drawings and the description to refer to the same or like parts.

Figure 2A:
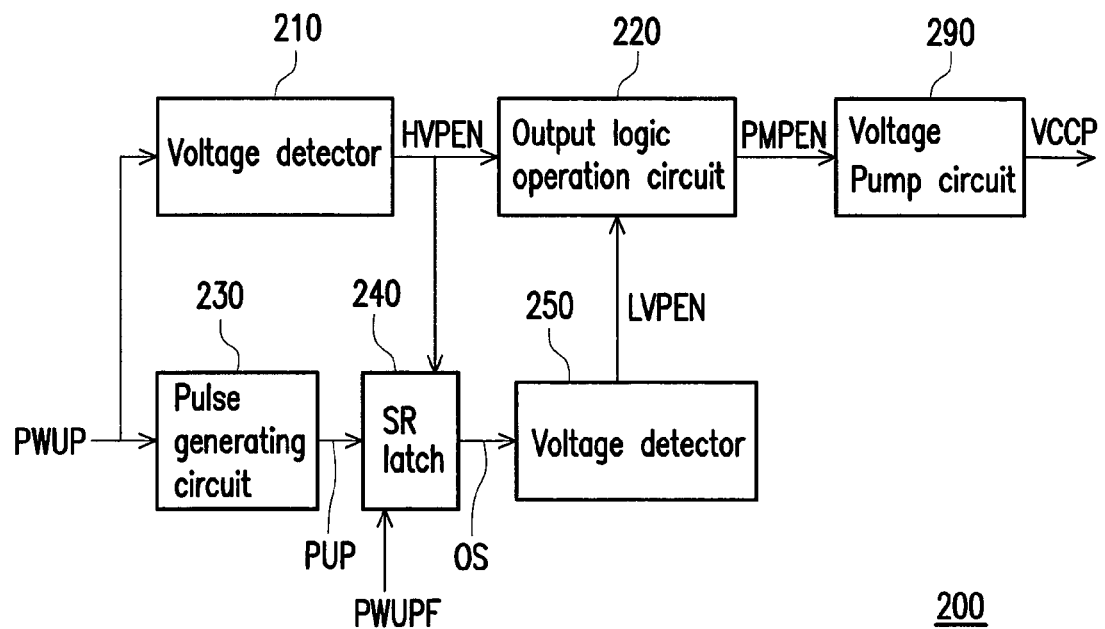
FIG. 2A is a block diagram of a low power protection circuit according to an embodiment of the present invention.

Referring to FIG. 2A, FIG. 2A is a block diagram of a low power protection circuit according to an embodiment of the present invention. The low power protection circuit 200 includes a voltage divider 210, an output logic operation circuit 220, a pulse generating circuit 230, a SR latch 240, and a voltage divider 250. The voltage detector 210 receives a power-up signal PWUP and generating a high-voltage pump enable signal HVPEN by detecting a voltage level of the power-up signal PWUP. That is, the voltage detector 210 may detects the voltage level of the power-up signal PWUP, and when the voltage level of the power-up signal PWUP is higher than a pr-determined value the voltage detector 210 generates the pump enable signal HVPEN with logic high (default value of the pump enable signal HVPEN may be logic low).

On the other hand, the power-up signal PWUP is generated according to a variation of a voltage level of the second operating voltage. The power-up signal PWUP may be asserted when the voltage level of the second operating voltage reaches a power-up level, wherein the power-up level is a preset value.

The power-up signal PWUP is also received by the pulse generating circuit 230. The pulse generating circuit 230 generates a power-up pulse PUP according to the power-up signal PWUP. The pulse generating circuit 230 may be a one shot circuit, and the pulse generating circuit 230 may generate the power-up pulse PUP by referring one of the transition edges of the power-up signal PWUP.

The SR latch 240 is coupled to the pulse generating circuit 230, and a set end of the SR latch 240 receives the power-up pulse PUP, and the first and second reset ends of the SR latch 240 respectively receives the pump enable signal HVPEN and an inverted power-up signal PWUPF. The SR latch 240 generates an output signal OS according to the pump enable signal HVPEN, the inverted power-up signal PWUPF, and the power-up signal PWUP. The output signal OS may be set to logic high by the power-up signal PWUP, and the output signal OS may be reset to logic low by at least one of the pump enable signal HVPEN and the inverted power-up signal PWUPF.

The voltage detector 250 is coupled to the SR latch 240 and receives the output signal OS from the SR latch 240. The voltage detector 250 generates a low-voltage pump enable signal LVPEN by detecting a voltage level of the output signal OS.

The output logic operation circuit 220 is coupled to the voltage detector 250 and 250. The output logic operation circuit 220 receives the high-voltage pump enable signal HVPEN and the low-voltage pump enable signal LVPEN, and performs a logic operation on the high-voltage pump enable signal HVPEN and the low-voltage pump enable signal LVPEN to generate the pump enable signal PMPEN. In an embodiment of the disclosure, the logic operation performed by the output logic operation circuit 220 may be an OR operation. The pump enable signal PMPEN is transported to the voltage pump circuit 290 for enable or disable an operation of the voltage pump circuit 290. When the voltage pump circuit 290 is enabled, a pump out voltage VCCP is generated by the voltage pump circuit 290, and when the voltage pump circuit 290 is disabled, a pump output voltage VCCP is not generated by the voltage pump circuit 290.

Figure 2B:
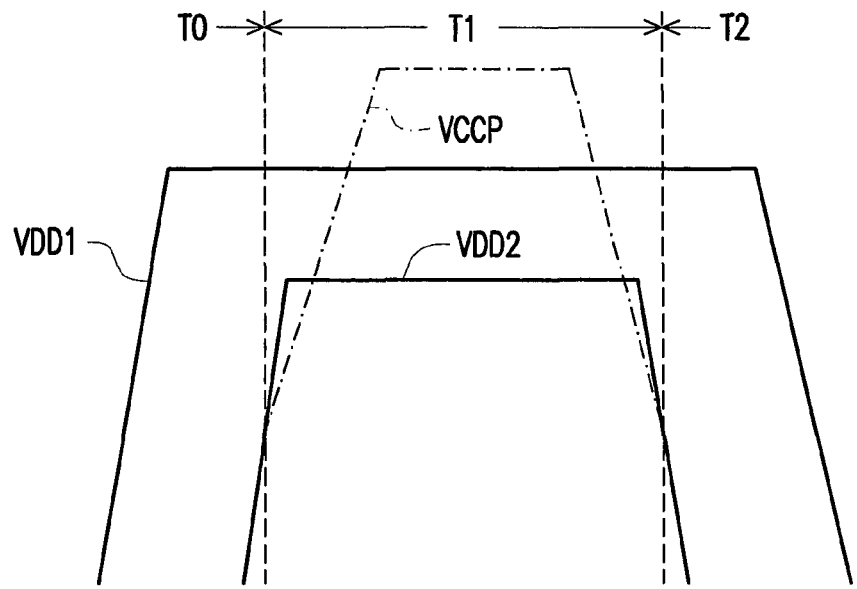
FIG. 2B is a waveform plot of the low power protection circuit according to the embodiment in FIG. 2A.

About the operation of the low power protection circuit 200, please refer to FIG. 2A and FIG. 2B, wherein FIG. 2B is a waveform plot of the low power protection circuit according to the embodiment in FIG. 2A. In FIG. 2A, the first operating voltage VDD1 rises gradually during a timing period T0, and the first operating voltage VDD1 rises to full level before the second operating voltage VDD2. When the first operating voltage VDD1 rises to full level, and the second operating voltage VDD2 does not reach to full level during the timing period T0, the power-up signal PWUP is logic low, and the high-voltage pump enable signal HVPEN and the low-voltage pump enable signal LVPEN are logic low accordingly to the power-up signal PWUP. The pump enable signal PMPEN generated by the output logic operation circuit 220 is logic low, and the voltage pump circuit 290 stops to generate the pump output voltage VCCP during the timing period T0.

The power-up signal PWUP is asserted during a timing period T1 by following the rising of the second operating voltage VDD2. When the power-up signal PWUP is larger than the pre-determined value, the high-voltage pump enable signal HVPEN varies to logic high, and the pump enable signal PMPEN goes to logic high, too. The low-voltage pump enable signal LVPEN goes to high momentarily at same time as the high-voltage pump enable signal HVPEN, but then the low-voltage pump enable signal LVPEN shuts off to logic low. At this time, the voltage pump circuit 290 is enabled for generating the pump output voltage VCCP during the timing period T1.

Please notice here, if the first operating voltage VDD1 rises with or after the second operating voltage VDD2, the power-up signal PWUP may trip before the pump output voltage VCCP reaching to full level. The power-up pulse PUP is generated by the pulse generating circuit 210 and the low-voltage pump enable signal LVPEN is asserted. The pump enable signal PMPEN is logic high, and the voltage pump circuit 290 is enabled to generate the pump output voltage VCCP.

During the timing period T2, the low power protection circuit 200 enters a powering down mode. Initially for the powering down mode, the high-voltage pump enable signal HVPEN is logic high, and the low-voltage pump enable signal LVPEN is logic low. During the timing period T2, firstly, the first operating voltage VDD1 keeps at full level and the second operating voltage VDD2 drops to a voltage level lower than a pre-determined voltage, and the high-voltage pump enable signal HVPEN trips to logic low. Correspondingly, the pump enable signal PMPEN trips to logic low, and the voltage pump circuit 290 is disabled.

Accordingly, the pump output voltage VCCP is not generated when the first and/or second operating voltages VDD1, VDD2 is not full level, and a runaway situation of the voltage pump circuit 290 is not happened of present disclosure.

When the first and second operating voltages VDD1 and VDD2 drop at same time or the first operating voltage VDD1 drops before the second operating voltage VDD2, operations of the low power protection circuit 200 are as same as the operation mentioned above about the powering down mode during the timing period T2.

Figure 3:
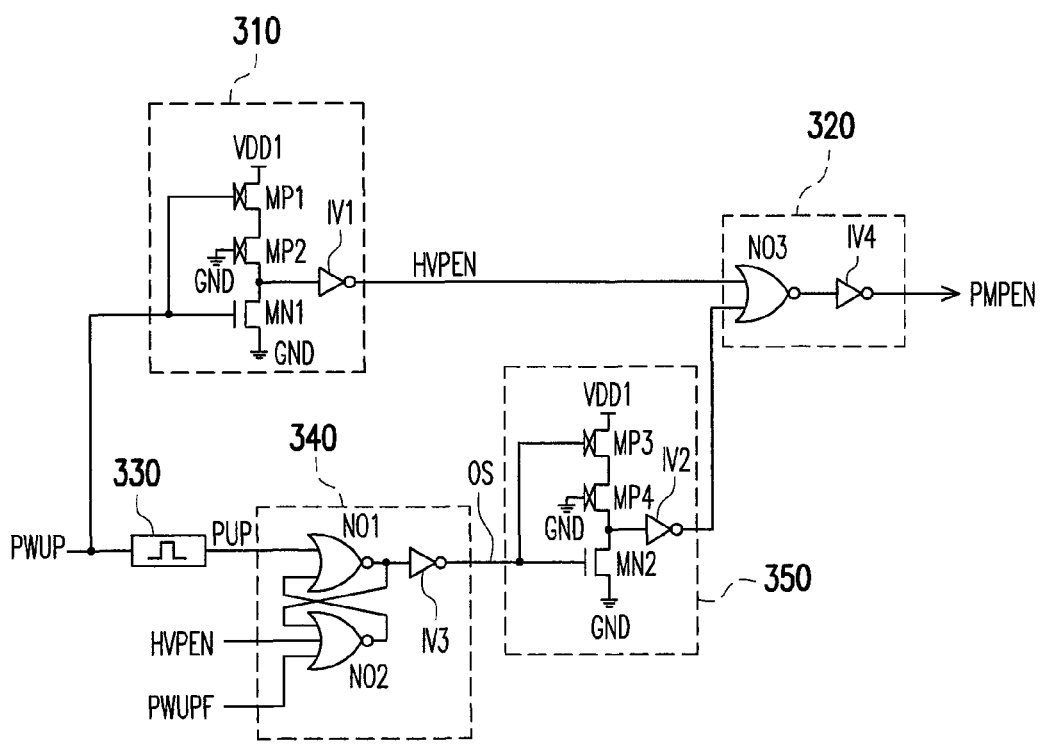
FIG. 3 is a circuit diagram of a low power protection circuit according to the other embodiment of the present invention.

Referring to FIG. 3, FIG. 3 is a circuit diagram of a low power protection circuit according to the other embodiment of the present invention. The voltage detector 310 includes transistors MP1, MP2 and MN1 and inverter IV1. A first end of the transistor MP1 is coupled to the first operating voltage VDD1, a control end of the transistor MP1 receives the power-up signal PWUP, and a second end of the transistor MP1 is coupled to a first end of the transistor MP2. A control end of the transistor MP2 is coupled to a reference ground GND, and a second end of the transistor MP2 is coupled to a first end of the transistor MN1. A control end of the transistor MN1 receives the power-up signal PWUP, and a second end of the transistor MN1 is coupled to the reference ground GND. An input end of the inverter IV1 is coupled to the second end of the transistor MP2, an output end of the inverter IV1 generates the high-voltage pump enable signal HVPEN.

The transistor MP1 is a P-type transistor with low threshold voltage. The transistor MP2 is a P-type transistor with long channel length. The transistor MN1 is a N-type transistor with long channel length.

The voltage detector 350 includes transistors MP3, MP4 and MN2 and inverter IV2. A first end of the transistor MP3 is coupled to the first operating voltage VDD1, a control end of the transistor MP3 receives the output signal OS, and a second end of the transistor MP3 is coupled to a first end of the transistor MP4. A control end of the transistor MP2 is coupled to the reference ground GND, and a second end of the transistor MP2 is coupled to a first end of the transistor MN1. A control end of the transistor MN2 receives the output signal OS, and a second end of the transistor MN2 is coupled to the reference ground GND. An input end of the inverter IV2 is coupled to the second end of the transistor MP4, an output end of the inverter IV2 generates the low-voltage pump enable signal LVPEN.

The transistor MP3 is a P-type transistor with low threshold voltage. The transistor MP4 is a P-type transistor with long channel length. The transistor MN2 is a N-type transistor with long channel length.

The SR latch 340 includes NOR gates NO1, NO2 and inverter IV3. A first input end of the NOR gate NO1 forms a set end of the SR latch 340 for receiving the power-up pulse PUP from the pulse generating circuit 330. A second end of the NOR gate NO1 is coupled to an output end of the NOR gate NO2. A first input end of the NOR gate NO2 is coupled to an output end of the NOR gate NO1, second and third ends of the NOR gate NO2 form the reset ends of the SR latch 340 respectively receive the high-voltage pump enable signal HVPEN and an inverted power-up signal PWUPF. The inverted power-up signal PWUPF and the power-up signal PWUPF are complementary. An input end of the inverter IV3 is coupled to the output end of the NOR gate NO1, and an output end of the inverter IV3 generates the output signal OS.

The output logic operation circuit 320 includes a NOR gate NO3 and an inverter IV4. The NOR gate NO3 receives the high-voltage pump enable signal HVPEN and the low-voltage pump enable signal LVPEN, and an output end of the NOR gate NO3 is coupled to an input end of the inverter IV4. Furthermore, an output end of the inverter IV4 outputs the pump enable signal PMPEN. The output logic operation circuit 320 performs an OR operation on the high-voltage pump enable signal HVPEN and the low-voltage pump enable signal LVPEN to generate the pump enable signal PMPEN.

Figure 4:
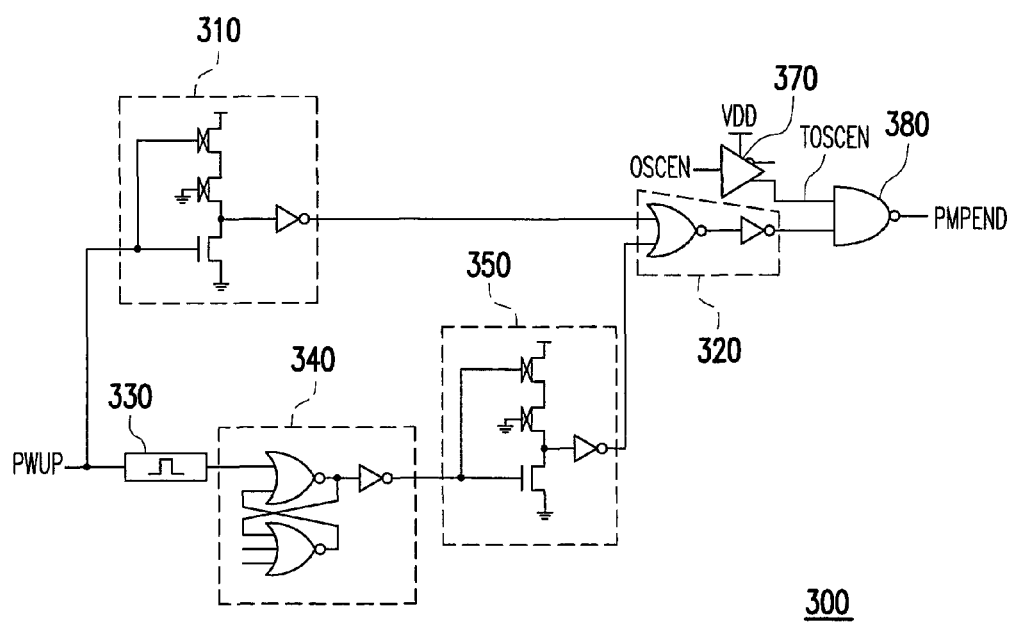
FIG. 4 is a circuit diagram of the low power protection circuit according to another embodiment of the present invention.

Referring to FIG. 4, FIG. 4 is a circuit diagram of the low power protection circuit according to another embodiment of the present invention. In FIG. 4, different from FIG. 3, the low power protection circuit 300 further includes a voltage level translator 370 and a logic operation circuit 380. The voltage level translator 370 receives a voltage pump oscillator enable signal OSCEN and translates a voltage of the voltage pump oscillator enable signal OSCEN for generating a translated voltage pump oscillator enable signal TOSCEN. The logic operation circuit 380 receives the translated voltage pump oscillator enable signal TOSCEN and the pump enable signal PMPEN, and the logic operation circuit 380 generates an output pump enable signal PMPENO by operating an AND or NAND operation on the translated voltage pump oscillator enable signal TOSCEN and the pump enable signal PMPEN.

In summary, the low power protection circuit of present disclosure provides the pump enable signal by detecting the voltage variation of the operating voltages of the DRAM. That is, the pump output voltage generated by the voltage pump circuit can be controlled by the low power protection circuit, and the runaway situation can be avoided.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents

What is claimed is:

1. A low power protection circuit, adapted for a dynamic random access memory (DRAM) with dual operating voltages, comprising:
    a first voltage detector, receiving a power-up signal and generating a high-voltage pump enable signal by detecting a voltage level of the power-up signal;
    a pulse generating circuit, receiving the power-up signal and generating a power-up pulse according to the power-up signal;
    a SR latch, having a set end, a first and second reset ends and an output end, the set end receiving the power-up pulse, the first and second reset ends respectively receiving the high-voltage pump enable signal and an inverted power-up signal, and the output end generating an output signal;
    a second voltage detector, receiving the output signal and generating a low-voltage pump enable signal by detecting a voltage level of the output signal; and
    an output logic operation circuit, receiving the low-voltage pump enable signal and the high-voltage pump enable signal and generating a pump enable signal according to the low-voltage pump enable signal and the high-voltage pump enable signal,
    wherein, the pump enable signal is used to enable or disable an operation of a voltage pump circuit of the DRAM.

2. The low power protection circuit according to claim 1, wherein the dual operating voltages are a first operating voltage and a second operating voltage, and a voltage level of the first operating voltage is larger than a voltage level of the second operating voltage.

3. The low power protection circuit according to claim 1, wherein the power-up signal is generated by whether the voltage level of the second operating voltage is larger than a power-up level or not,
    wherein, the power-up level is a preset value.

4. The low power protection circuit according to claim 1, wherein the first voltage detector comprises:
    a first transistor, has a first end, a second end, and a control end, the first end of the first transistor is coupled to the first operating voltage, the control end of the first transistor receives the power-up signal;
    a second transistor, has a first end, a second end, and a control end, the first end of the second transistor is coupled to the second end of the first transistor, the control end of the second transistor is coupled to a reference ground;
    a third transistor, has a first end, a second end, and a control end, the first end of the third transistor is coupled to the second end of the second transistor, the control end of the third transistor is coupled to the control end of the first transistor for receiving the power-up signal, the second end of the third transistor is coupled to the reference ground; and
    an inverter, an input end of the inverter is coupled to the second end of the second transistor, and an output end of the inverter generates the high-voltage pump enable signal.

5. The low power protection circuit according to claim 4, wherein the first and second transistors are P-type transistors and the third transistor is a N-type transistor.

6. The low power protection circuit according to claim 1, wherein the output logic operation circuit performs a OR logic operation on the low-voltage pump enable signal and the high-voltage pump enable signal for generating the pump enable signal.

7. The low power protection circuit according to claim 6, wherein the output logic operation circuit comprises:
    a NOR gate receives the low-voltage pump enable signal and the high-voltage pump enable signal; and
    an inverter, an input end of the inverter is coupled to the output end of the NOR gate, an output end of the inverter generates the pump enable signal.

8. The low power protection circuit according to claim 1, wherein the second voltage detector comprises:
    a first transistor, has a first end, a second end, and a control end, the first end of the first transistor is coupled to the first operating voltage, the control end of the first transistor receives the output signal;
    a second transistor, has a first end, a second end, and a control end, the first end of the second transistor is coupled to the second end of the first transistor, the control end of the second transistor is coupled to a reference ground;
    a third transistor, has a first end, a second end, and a control end, the first end of the third transistor is coupled to the second end of the second transistor, the control end of the third transistor is coupled to the control end of the first transistor for receiving the output signal, the second end of the third transistor is coupled to the reference ground; and an inverter, an input end of the inverter is coupled to the second end of the second transistor, and an output end of the inverter generates the high-voltage pump enable signal.

9. The low power protection circuit according to claim 1, wherein the SR latch comprises:

a first NOR gate, a first input end of the first NOR gate receives the power-up pulse;

a second NOR gate, a first input end of the second NOR gate is coupled to an output end of the first NOR gate, a second input end of the second NOR gate receives the high-voltage pump enable signal, a third input end of the second NOR gate receives an inverted power-up signal, and an output end of the second NOR gate is coupled to a second input end of the first NOR gate; and an inverter, an input end of the inverter is coupled to the output end of the first NOR gate, an output end of the inverter generates the output signal.

10. The low power protection circuit according to claim 1, further comprises:

a voltage level translator, receiving a voltage pump oscillator enable signal and translating a voltage of the voltage pump oscillator enable signal for generating a translated voltage pump oscillator enable signal; and a logic operation circuit, receiving the translated voltage pump oscillator enable signal and the pump enable signal, and generating an output pump enable signal by operating an AND or NAND operation on the translated voltage pump oscillator enable signal and the pump enable signal.

* * * * *